United States Patent
Rozenblit et al.

(10) Patent No.: US 8,396,436 B2
(45) Date of Patent: *Mar. 12, 2013

(54) SYSTEM AND METHOD FOR CLOSED LOOP POWER CONTROL CALIBRATION

(75) Inventors: Dmitriy Rozenblit, Irvine, CA (US); Tirdad Sowlati, Irvine, CA (US); Dongsoo Daniel Koh, Irvine, CA (US); Rajasekhar Pullela, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/311,355

(22) Filed: Dec. 5, 2011

(65) Prior Publication Data

US 2012/0134401 A1 May 31, 2012

Related U.S. Application Data

(63) Continuation of application No. 11/589,472, filed on Oct. 30, 2006, now Pat. No. 8,073,410.

(51) Int. Cl.
*H01Q 11/12* (2006.01)
*H04B 1/04* (2006.01)

(52) U.S. Cl. .................. 455/127.1; 455/115.2; 455/108

(58) Field of Classification Search .......... 455/103–113, 455/114.2–114.3, 115.1–115.2, 126, 127.1–127.5
See application file for complete search history.

(56) References Cited

U.S. PATENT DOCUMENTS

| | | | |
|---|---|---|---|
| 5,381,108 A | 1/1995 | Whitmarsh et al. | |
| 7,149,474 B1 | 12/2006 | Mikhak | |
| 7,450,907 B2 | 11/2008 | Shurvinton et al. | |
| 7,643,805 B2 | 1/2010 | Tan et al. | |
| 7,653,359 B2 | 1/2010 | Darabi | |
| 8,073,410 B2 * | 12/2011 | Rozenblit et al. | 455/127.1 |
| 2005/0118963 A1 | 6/2005 | Chiu | |
| 2008/0101185 A1 | 5/2008 | Rozenblit et al. | |

FOREIGN PATENT DOCUMENTS

| | | |
|---|---|---|
| WO | WO 02/060088 | 8/2002 |
| WO | WO 2004/084460 | 9/2004 |
| WO | WO 2005/041438 | 5/2005 |
| WO | WO 2008/054673 A1 | 5/2008 |

* cited by examiner

*Primary Examiner* — Christian Hannon
(74) *Attorney, Agent, or Firm* — Knobbe Martens Olson & Bear LLP

(57) ABSTRACT

A system for calibrating a closed power control loop includes an adder configured to inject a test signal into an adjustable element, a first peak detector configured to determine an amplitude of the injected test signal, a second peak detector configured to determine an amplitude of a return test signal, a comparator configured to determine the difference between the injected test signal and the return test signal, and a calibration engine configured to adjust the adjustable element so that the return test signal is offset from the injected test signal by a predetermined amount.

23 Claims, 5 Drawing Sheets

SYSTEM AND METHOD FOR CLOSED LOOP POWER CONTROL CALIBRATION

RELATED APPLICATIONS

This application is a continuation of U.S. patent application Ser. No. 11/589,472, filed Oct. 30, 2006, entitled "SYSTEM AND METHOD FOR CLOSED LOOP POWER CONTROL CALIBRATION," the benefit of the filing date of which is hereby claimed and the specification of which is incorporated herein by this reference.

BACKGROUND

Radio frequency (RF) transmitters are found in many one-way and two-way communication devices, such as portable communication devices (cellular telephones), personal digital assistants (PDAs) and other communication devices. An RF transmitter transmits using whatever communication methodology is dictated by the particular communication system within which it is operating. For example, communication methodologies typically include amplitude modulation, frequency modulation, phase modulation, or a combination of these. In a typical global system for mobile communications (GSM) communication system using narrowband TDMA technology, a GMSK modulation scheme supplies a low noise phase modulated (PM) transmit signal to a non-linear power amplifier directly from an oscillator.

In such an arrangement, a non-linear power amplifier, which is highly efficient, can be used, thus allowing efficient transmission of the phase-modulated signal and minimizing power consumption. Because the modulated signal is supplied directly from an oscillator, the need for filtering, either before or after the power amplifier, is minimized.

One manner of controlling the output of the power amplifier is referred to as a closed-loop power control system. In a closed-loop power control system, a portion of the output of the power amplifier is diverted to closed-loop power control circuitry associated with the power amplifier. The closed-loop power control circuitry analyzes a number of factors, including a power control signal generated in the device and the power output of the power amplifier, and determines the optimal desired power to be output from the power amplifier. The closed-loop power control circuitry then delivers a power control signal to the power amplifier to control the power amplifier power output.

In a closed-loop power control system, the behavior of the power control loop, as well as overall system performance, depends to a large degree on the bandwidth of the power control loop and on the phase and gain margins of the power control loop.

Ideally, the bandwidth of the closed power control loop is maintained within a certain, and sometimes narrow, range to provide proper system functionality and to eliminate any out-of-band noise so as to comply with cellular transmission standards. One manner of calibrating a closed power control loop requires costly external components and dedicated test equipment. Such a calibration system is also time consuming.

Therefore, it would be desirable to minimize complexity and duration when calibrating a closed power control loop.

SUMMARY

A system for calibrating a closed power control loop includes an adder configured to inject a test signal into an adjustable element, a first peak detector configured to determine an amplitude of the injected test signal, a second peak detector configured to determine an amplitude of a return test signal, a comparator configured to determine the difference between the injected test signal and the return test signal, and a calibration engine configured to adjust the adjustable element so that the return test signal is offset from the injected test signal by a predetermined amount.

Related methods of operation are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Figure 1:
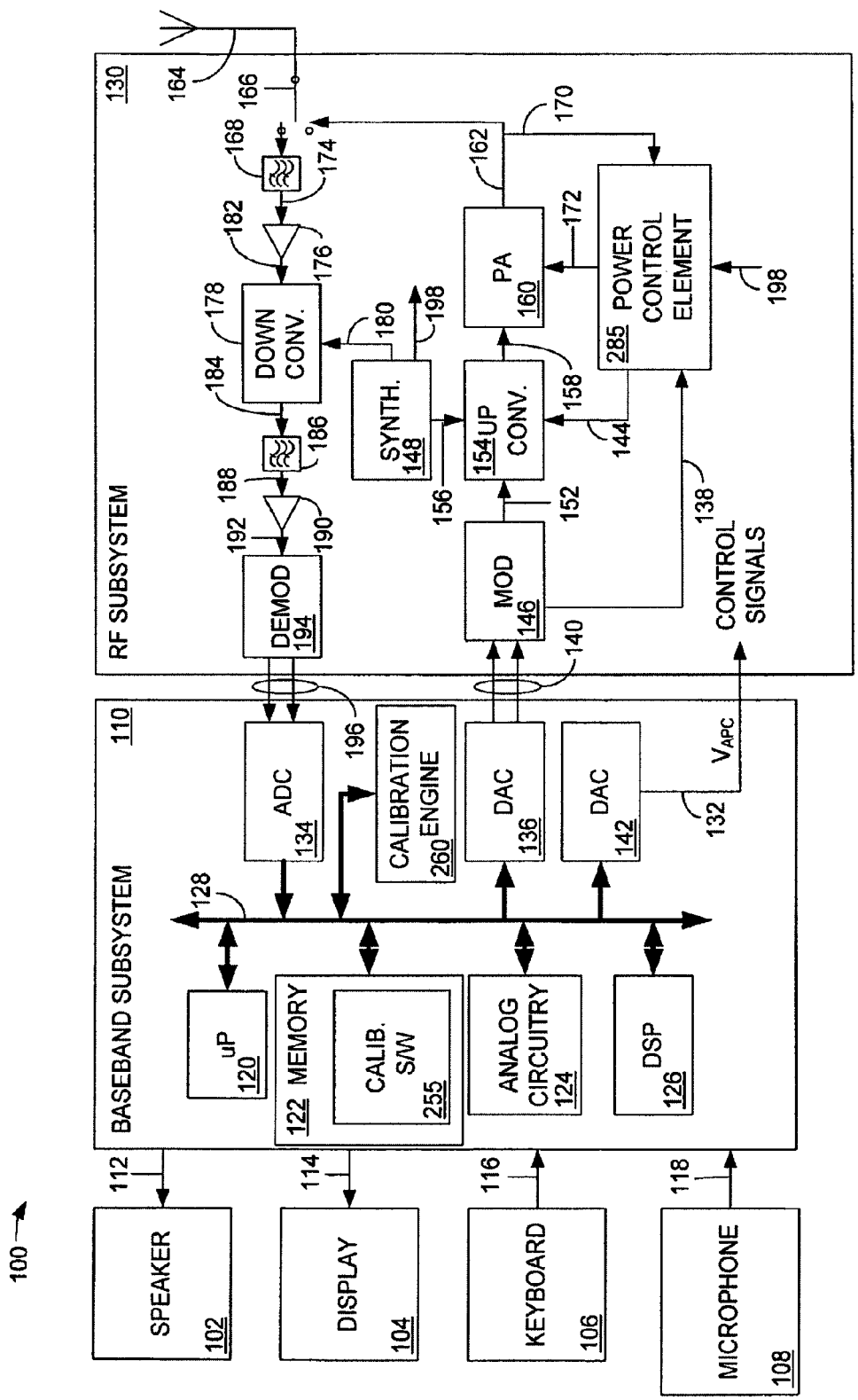
FIG. 1 is a block diagram illustrating a simplified portable transceiver.

Although described with particular reference to a portable transceiver, the system and method for closed loop power control calibration can be implemented in any system where it is desirable to transmit a combined signal including a PM component and an AM component and equalize the bandwidth of the respective AM and PM power control loops.

The system and method for closed loop power control calibration can be implemented in hardware, software, or a combination of hardware and software. When implemented in hardware, the system and method for closed loop power control calibration can be implemented using specialized hardware elements and logic. When the system and method for closed loop power control calibration is implemented partially in software, the software portion can be used to precisely control the calibration of the power control loop. The software can be stored in a memory and executed by a suitable instruction execution system (microprocessor). The hardware implementation of the system and method for closed loop power control calibration can include any or a combination of the following technologies, which are all well known in the art: discrete electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for the system and method for closed loop power control calibration comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance, optical scanning of the paper or other medium, then compiled, interpreted or otherwise processed in a suitable manner if necessary, and then stored in a computer memory.

FIG. 1 is a block diagram illustrating a simplified portable transceiver 100. The portable transceiver 100 includes speaker 102, display 104, keyboard 106, and microphone 108, all connected to baseband subsystem 110. In a particular embodiment, the portable transceiver 100 can be, for example but not limited to, a portable telecommunication device such as a mobile cellular-type telephone. Speaker 102 and display 104 receive signals from the baseband subsystem 110 via connections 112 and 114, respectively, as known to those skilled in the art. Similarly, keyboard 106 and microphone 108 supply signals to the baseband subsystem 110 via connections 116 and 118, respectively. The baseband subsystem 110 includes microprocessor (μP) 120, memory 122, analog circuitry 124, digital signal processor (DSP) 126 and calibration engine 260 in communication via bus 128. The bus 128, though shown as a single bus, may be implemented using a number of busses connected as necessary among the subsystems within baseband subsystem 110. The microprocessor 120 and the memory 122 provide the signal timing, processing and storage functions for the portable transceiver 100. If portions of the system and method for closed loop power control calibration are implemented in software, then the memory 122 also includes calibration software 255 that can be executed by the microprocessor 120, DSP 126 or by another processor.

The analog circuitry 124 provides the analog processing functions for the signals within baseband subsystem 110. The baseband subsystem 110 provides control signals to radio frequency (RF) subsystem 130 via connection 132. In one embodiment, the baseband subsystem 110 provides an automatic power control signal (supplied as an analog voltage signal and referred to as $V_{APC}$) to the RF subsystem 130. Although shown as a single connection 132, the control signals may originate from the DSP 126 from microprocessor 120, or from another element, and are supplied to a variety of points within the RF subsystem 130. It should be noted that, for simplicity, only the basic components of portable transceiver 100 are illustrated.

The baseband subsystem 110 also includes analog-to-digital converter (ADC) 134 and digital-to-analog converters (DACs) 136 and 142. The ADC 134 and DACs 136 and 142 also communicate with microprocessor 120, memory 122, analog circuitry 124, DSP 126 and calibration engine 260 via bus 128. While shown as two separate DACs 136 and 142, a single DAC may be implemented. The DAC 136 converts the digital communication information within baseband subsystem 110 into an analog signal for transmission to RF subsystem 130 via connection 140. Connection 140, while shown as two directed arrows, includes the information that is to be transmitted by RF subsystem 130 after conversion from the digital domain to the analog domain. The DAC 136 supplies baseband in-phase (I) and quadrature-phase (Q) components of the information signal to be transmitted via connection 140 to the modulator 146. In such an embodiment, the modulator 146 is an I/Q modulator as known in the art. Other modulation methodologies may also be employed. The DAC 142 supplies control signals to various components with RF subsystem 130 via connection 132.

The modulator 146 modulates the I and Q information signals received from the DAC 136 onto an LO signal and provides a modulated signal via connection 152 to upconverter 154. The modulator 146 also supplies an intermediate frequency (IF) signal containing only the desired amplitude modulated (AM) signal component on connection 138 for input to the power control element 285 via connection 138. In an embodiment, as will be described below, the AM signal supplied by the modulator via connection 138 can first be supplied to a reference variable gain element, and then supplied to a detector and a logarithmic amplifier associated with the RF subsystem 130. The AM signal supplied by the modulator 146 is an intermediate frequency (IF) AM signal with a constant (average) power level that is supplied as a reference signal ($V_{REF}$) to the reference variable gain element to be described below. The power control element 285 also supplies to the upconverter 154 via connection 144 a constant level IF signal containing the phase modulated (PM) component of the transmit signal. The operation of the power control element 285 will be described below with reference to FIG. 2.

The upconverter 154 receives a frequency reference signal (referred to as a "local oscillator" or "LO" signal) from synthesizer 148 via connection 156. The synthesizer 148 determines the appropriate frequency to which the upconverter 154 will translate the modulated signal on connection 152.

The upconverter 154 supplies a phase modulated signal at the appropriate transmit frequency via connection 158 to power amplifier 160. The power amplifier 160 amplifies the phase-modulated signal on connection 158 to the appropriate power level and applies the amplitude modulation for transmission via connection 162 to antenna 164. Illustratively, switch 166 controls whether the amplified signal on connection 162 is transferred to antenna 164 or whether a received signal from antenna 164 is supplied to filter 168. The operation of switch 166 is controlled by a control signal from baseband subsystem 110 via connection 132.

A portion of the amplified transmit signal power on connection 162 is supplied via connection 170 to power control element 285. The power control element 285 forms a continuous closed power control feedback loop and supplies a power amplifier (PA) power control voltage signal, referred to as $V_{PC}$, on connection 172 instructing the power amplifier

160 as to the power to which the signal on connection 158 should be amplified. The power control element 285 also receives the LO signal from synthesizer 148 via connection 198. The operation of power control element 285 will be described in further detail with respect to FIG. 2.

A signal received by antenna 164 may, at the appropriate time determined by baseband subsystem 110, be directed via switch 166 to a receive filter 168. The receive filter 168 filters the received signal and supplies the filtered signal on connection 174 to a low noise amplifier (LNA) 176. The receive filter 168 may be a bandpass filter that passes all channels of the particular cellular system where the portable transceiver 100 is operating. As an example, for a 900 MHz GSM system, receive filter 168 would pass all frequencies from 935.1 MHz to 959.9 MHz, covering all 124 contiguous channels of 200 kHz each. The purpose of the receive filter 168 is to reject all frequencies outside the desired region. An LNA 176 amplifies the very weak signal on connection 174 to a level at which downconverter 178 can translate the signal from the transmitted frequency back to a baseband frequency. Alternatively, the functionality of the LNA 176 and the downconverter 178 can be accomplished using other elements, such as, for example but not limited to, a low noise block downconverter (LNB).

The downconverter 178 receives an LO signal from synthesizer 148 via connection 180. The LO signal determines the frequency to which to downconvert the signal received from the LNA 176 via connection 182. The downconverted frequency is called the intermediate frequency (IF). The downconverter 178 sends the downconverted signal via connection 184 to a channel filter 186, also called the "IF filter." The channel filter 186 filters the downconverted signal and supplies it via connection 188 to an amplifier 190. The channel filter 186 selects the one desired channel and rejects all others. Using the GSM system as an example, only one of the 124 contiguous channels is actually to be received. After all channels are passed by the receive filter 168 and downconverted in frequency by the downconverter 178, only the one desired channel will appear precisely at the center frequency of channel filter 186. The synthesizer 148, by controlling the local oscillator frequency supplied on connection 180 to downconverter 178, determines the selected channel. The amplifier 190 amplifies the received signal and supplies the amplified signal via connection 192 to demodulator 194. The demodulator 194 recovers the transmitted analog information and supplies a signal representing this information via connection 196 to the ADC 134. The ADC 134 converts these analog signals to a digital signal at baseband frequency and transfers them via bus 128 to DSP 126 for further processing.

Figure 2:
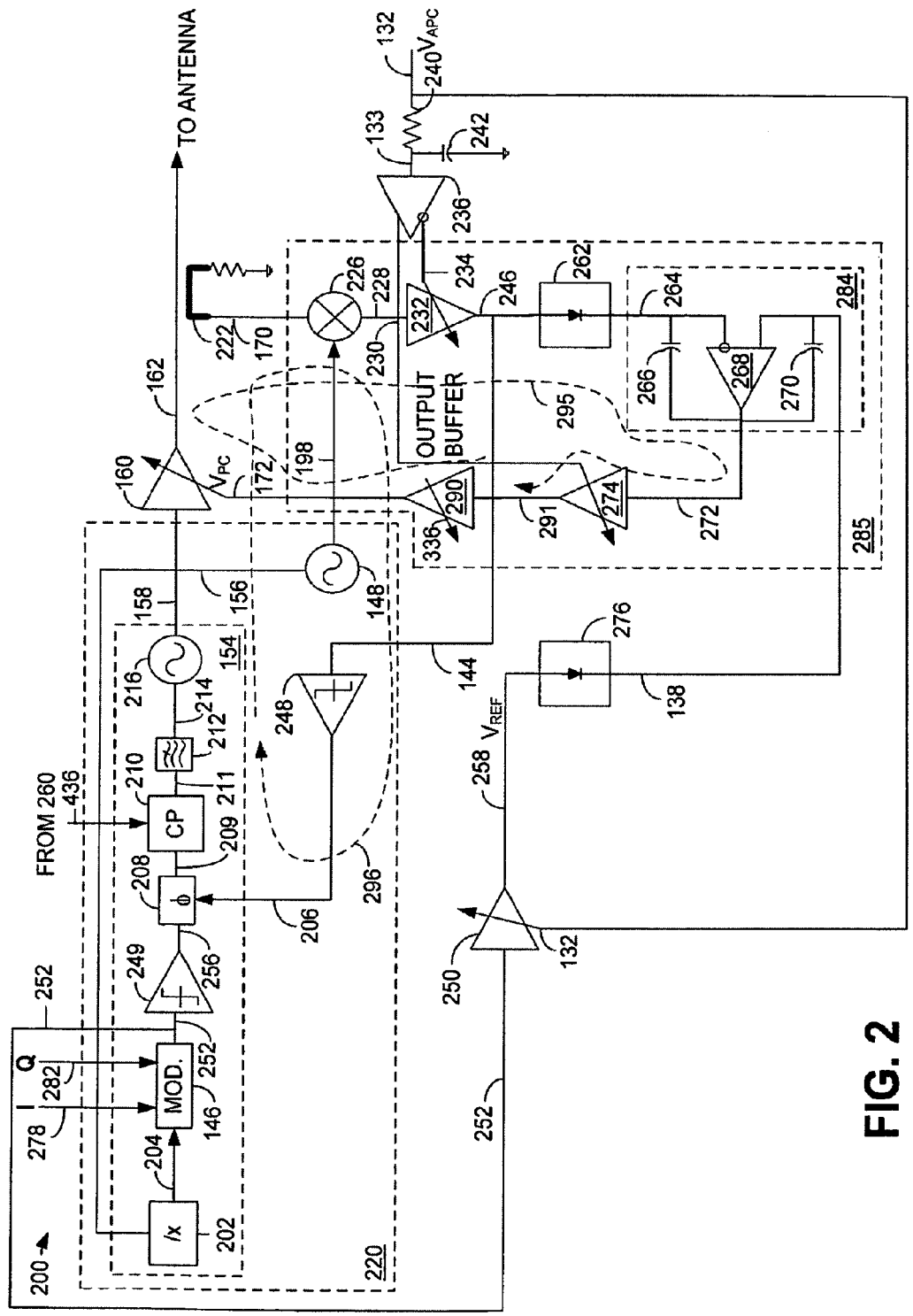
FIG. 2 is a block diagram illustrating a system and method for closed loop power control calibration.

FIG. 2 is a block diagram 200 illustrating an embodiment of the system and method for closed loop power control calibration. Beginning with a description of the power control element 285, a portion of the output power present at the output of power amplifier 160 on connection 162 is diverted by a coupler 222 via connection 170 and input to a mixer 226 in the feedback path. The mixer 226 also receives the local oscillator (LO) signal from synthesizer 148 via connection 198.

The mixer 226 downconverts the RF signal on connection 170 to an intermediate frequency (IF) signal on connection 228. For example, the mixer 226 translates a signal having a frequency of approximately 2 gigahertz (GHz) on connection 170 to a frequency of approximately 100 megahertz (MHz) on connection 228 for input to a variable gain element 232. The variable gain element 232 can be, for example but not limited to, a variable gain amplifier or an attenuator. In such an arrangement, the variable gain element 232 might have a total variable gain range of approximately 70 dB. The variable gain element 232 receives a control signal input from the inverting output of amplifier 236 via connection 234. The input to amplifier 236 is supplied via connection 132 from the DAC 142 of FIG. 1. The signal on connection 132 is the reference voltage automatic power control signal, $V_{APC}$, that determines the transmit power level and provides the power profile. The $V_{APC}$ signal on connection 132 is supplied to a reconstruction filter, which includes resistor 240 and capacitor 242. In this manner, a power control signal for the transmit power level and power profile is supplied via connection 234 to the control input of the variable gain element 232.

The output of variable gain element 232 on connection 246 is at an IF and includes modulation having both an AM component and a PM component and is called the "power measurement signal." This power measurement signal is related to the absolute output power of power amplifier 160, and includes a very small error related to the AM and PM components present in the signal. The output of variable gain element 232 on connection 246 is supplied to the input of a power detector 262 and is also supplied to a limiter 248 in the phase locked loop 220, although the limiter 248 may reside outside of the PLL 220.

The IF signal on connection 246 includes both an AM component and a PM component. The IF signal on connection 246 is supplied to the power detector 262, which provides, on connection 264, a baseband signal representing the instantaneous level of IF power present on connection 246. The output of power detector 262 on connection 264 is supplied to the inverting input of amplifier 268.

The amplifier 268, capacitor 266 and capacitor 270 comprise a comparator 284, which provides the error signal used to control the power amplifier 160 via connection 272. The non-inverting input to the amplifier 268 is supplied via connection 138 from a reference power detector 276. The output of the modulator 146 on connection 252 is supplied to a reference variable gain element 250. The reference variable gain element 250 can be implemented as a variable gain amplifier (VGA), which is similar to the variable gain elements 232 and 274, but which has different gain characteristics. The signal supplied to the reference VGA on connection 252 comprises an IF signal containing the amplitude modulation (AM) portion of the modulated signal, which is an instantaneous envelope reference signal. The reference VGA 250 receives the $V_{APC}$ signal via connection 132 to its control input. The reference VGA 250 extends the dynamic range of the AM control signal that is supplied through the reference power detector 276 to the non-inverting input of the amplifier 268 in the comparator 284. The signal on connection 138 supplied to the non-inverting input of amplifier 268 contains the demodulated amplitude information of the AM signal developed by the modulator 146 in the phase locked loop 220.

The gain of the power control element 285 amplifies the signal on connection 272 such that the difference between the signals on connections 264 and 138 input to amplifier 268 provide an error signal on connection 272 that is used to control the output of the power amplifier 160.

The output of the amplifier 268 is supplied to the variable gain element 274, which can be similar in structure to the variable gain element 232. However, the variable gain element 274 has a gain function that is the inverse of the gain function of the variable gain element 232, since the control input to the variable gain element 274 is supplied from the non-inverting output of amplifier 236 and the control input to the variable gain element 232 is supplied from the inverting output of amplifier 236.

The output of the variable gain element 274 is supplied to an output buffer 290 via connection 291. The output buffer 290 applies a variable gain to the error signal in connection 291 and is controlled by the calibration engine 260 (FIG. 1). The operation of the output buffer 290 will be described in greater detail below. The output of the output buffer 290 is supplied as the PA power control voltage, $V_{PC}$, to the power amplifier 160.

In this manner, the PA power control voltage on connection 172 supplied to the control port of power amplifier 160 drives the power amplifier 160 to provide the proper output on connection 162, while compensating for gain control variations of the power amplifier 160.

The level of the signal on connection 264 and the level of the signal on connection 138 will be nearly equal, by the function of the negative feedback loop in the power control element 285. For example, if the gain of the variable gain element 232 is increased by a factor of 10, then the level of the output of power amplifier 160 will decrease accordingly to maintain equilibrium at the input of the amplifier 268. The output of the power amplifier 160 changes to cancel the gain change of the variable gain element 232. In this manner, the feedback amplitude signal on connection 264 remains nearly equal to the reference amplitude signal on connection 138. In this manner, a feedback signal containing an AM portion and a PM portion is present on connection 246. The signal on connection 246 is converted by power detector 262 from an IF signal to a baseband signal on connection 264. The difference between the signal on connection 264 and the signal on connection 138 is amplified by amplifier 268 and amplifier 274 to drive the power amplifier control port on connection 172 so that the desired signal is achieved at the output of the power amplifier 160 on connection 162. The power control element 285 has sufficient gain so that the error signal on connection 272 can be kept small. In such a case, the gain changes of the variable gain element 232 and the power amplifier 160 will substantially be the inverse of each other.

The amplifier 268 compares the power measurement signal on connection 264 with a reference voltage signal from the reference power detector 276 on connection 138, representing the AM portion of the signal supplied by the modulator 146. The output of amplifier 268 on connection 272 is the amplitude error signal. The DC voltage level on connection 138 affects the desired static output power for the power amplifier 268, irrespective of AM modulation. The amplifier 268 compares the signal level on connection 264 with the signal level on connection 138 and then amplifies the difference, thus providing an error signal on connection 272. The comparator 284 functions as an integrator, which is also a low pass filter.

The reference VGA 250 extends the amplitude control range of the power control element 285. The reference VGA 250, which is located outside of the amplitude control loop, controls the level of the reference signal supplied to the power control element 285. The gain characteristic of the reference VGA 250 differs from the gain characteristic of the variable gain elements 232 and 274. The reference VGA 250 maintains a constant gain over the majority of the amplitude range of the power control element 285, including the highest output amplitude levels. However, when the output amplitude is at the low end of the range (the range of the analog power control signal $V_{APC}$), i.e., when the value of $V_{APC}$ is low, the gain of the reference VGA 250 is reduced. In this manner, the reference VGA 250 maintains closed loop amplitude control down to the lowest output power levels, and particularly, during transmit power ramp-up and transmit power ramp-down, when $V_{APC}$ is at a predetermined minimum value. The gain range of the reference VGA 250 is realized as what is referred to as a "soft step" function, and is not linear. The gain of the reference VGA 250 is shifted down by an appropriate amount (for example 15 or 18 dB) when the signal $V_{APC}$ is at a level sufficiently low to indicate that the transmitter (e.g., the upconverter 154 and the power amplifier 160) is in either ramp-up or ramp-down and not at a constant output power level. The dynamic range of the power detectors 262 and 276 limits the amplitude control provided by the variable gain element 232 and the variable gain element 274. The reference VGA 250 provides amplitude control at power output levels lower than the minimum power output associated with a minimum $V_{APC}$ signal level. For example, the "soft step" function can be implemented for a $V_{APC}$ signal level of approximately 0.6V when it is known that the power control characteristic of the power amplifier 160 will always generate output power levels below 0 dBm for this value of $V_{APC}$ voltage.

The power amplifier control signal on connection 172 is driven by the variable gain element 274, which corrects for the effect that variable gain element 232 and the control input to the power amplifier 160 have on the transfer function of the power control element 285. The variable gains of variable gain element 232 and variable gain element 274 are complimentary. Because the feedback power measurement signal is present on connection 264 and the amplitude reference signal is present on connection 138, the amplifier 268 provides a dual function; (1) it amplifies the AM error signal (the difference between the signal on connection 138 and the signal on connection 264) so as to modulate the power output of power amplifier 160 via connection 172 to have the correct amount of AM; and (2) it performs the average power comparison and amplifies the result, thus providing a control signal also via connection 172 that drives the power amplifier 160 to the correct average power output. Therefore, at connection 172 both the AM error signal and the power control error signal are amplified to a level sufficient to drive the power amplifier 160 to the desired average power with the desired AM signal. In this manner, the desired AM portion of the signal is supplied to the control input 172 of power amplifier 160 and made present on the power amplifier output on connection 162. The mixer 226, variable gain element 232, power detector 262, amplifier 268 and variable gain element 274 provide a continuous closed-loop power control feedback system to control the power output of power amplifier 160, while allowing for the introduction of the AM portion of the transmit signal via connection 138.

In accordance with an embodiment of the system and method for closed loop power control calibration, a test signal is injected into the output buffer 290. The test signal may be at a frequency that approximates the frequency of the loop bandwidth. However, the test signal may be at a frequency that is higher or lower than the frequency of the loop bandwidth. In an embodiment, the injected signal is at approximately 100 millivolts (mV) and at a frequency of approximately 1.6 megahertz (MHz), because in this example, 1.6 MHz is the desired loop bandwidth. The test signal may be generated by dividing the system reference clock (in this example either 13 MHz or 26 MHz) by 8 or 16, respectively. In this example, the test signal would be at approximately 1.62 megahertz (MHz). In this example, the injected test signal represents the nominal desired bandwidth of the power control loop represented by the power control element 285. However, the test signal may have a frequency higher or lower than the desired loop bandwidth. The injected test signal travels through the power control loop, as indicated using the dotted arrow 295 and is analyzed at the output of the variable gain element 274. This signal is referred to as a "return" test signal. The bandwidth of the power control loop can be determined by determining a difference between the amplitude of the injected test signal and the amplitude of the return test signal. Depending on the amplitude of the return test signal, the calibration engine 260 adjusts the gain of the output buffer 290 so that the bandwidth of the loop is at the desired bandwidth. The operation of the output buffer 290 will be described in greater detail below.

At all times, the continuous power-control feedback loop allows the correction of any phase shift caused by power amplifier 160. In this manner, the PLL 220 includes a feedback loop for looping back the output of power amplifier 160 to the input of phase/frequency detector 208. Any unwanted phase shift generated by the power amplifier 160 will be corrected by the PLL 220. The output of variable gain element 232 passes any phase distortion present via connection 246 to limiter 248 for correction by the PLL 220. As such, the phase of the output of power amplifier 160 is forced to follow the phase of the LO signal on connection 156.

In order to remove the AM from the output of variable gain element 232, the variable gain element 232 is connected via connection 246 and connection 144 to the input of limiter 248. The limiter 248 develops a feedback signal containing only a PM component on connection 206. The baseband I and Q information signals are supplied to the modulator 146 via connections 278 and 282, respectively. The I and Q baseband information signal interface is understood by those skilled in the art. As a result of the operation of the modulator 146, the output on connection 252 is an intermediate frequency signal including an AM component providing an AM reference signal and a PM component providing a PM reference signal. The output of modulator 146 is supplied via connection 252 to the reference VGA 250. The output of the reference VGA 250 is supplied to the reference power detector 276 to ensure that the reference power detector 276 receives a signal having constant average power, thus reducing the dynamic range requirement of the reference power detector 276 to only what is needed to cover the modulation range, which is typically less than 20 dB. The output of the reference power detector 276 is a voltage signal representing the amplitude of the desired transmit signal. In this manner, the signal provided on connection 138 is a reference signal that allows amplitude control of the power control element 285 at power output levels over the full output power range, thus expanding the closed loop power control range of the power control element 285 to over 65 dB.

The modulator 146 also provides the PM component of the signal on connection 252. This PM signal is then supplied to limiter 249, which outputs a signal on connection 256 containing the phase reference component of the transmit signal. The components within the phase locked loop 220 provide gain for the comparison of the PM on connection 256 and the phase feedback signal on connection 206, thus providing a phase error output of the phase detector 208 on connection 209. In this manner, a feedback signal taken from the output of variable gain element 232 on connection 246 is supplied as continuous feedback to the phase locked loop 220.

It should be noted that even when the power amplifier 160 is not operating, there will always be some small leakage through the power amplifier 160 onto connection 162. This small leakage is sufficient to provide a feedback signal through the variable gain element 232 and into the phase locked loop 220 such that the phase locked loop 220 can be locked using just the leakage output of power amplifier 160. In this manner, a single feedback loop can be used to continuously control the output power of power amplifier 160 from the time that the amplifier is off through the time when the amplifier 160 is providing full output power.

The modulator 146 receives an LO input signal from synthesizer 148 via connection 156. The LO signal is frequency divided by a number "x" in order to provide a signal having an appropriate frequency on connection 204. The number "x" is chosen so as to minimize the design complexity of the synthesizer 148 and can be, for example, but not limited to, chosen to convert the output of the synthesizer 148 to a frequency of about 100 MHz.

The output of phase/frequency detector 208 on connection 209 is a digital signal having a value of either a 0 or a 1 with a very small transition time between the two output states. This signal on connection 209 is supplied to a charge pump 210. The charge pump 210 is an adjustable gain element that applies a variable gain to the signal on connection 209. The charge pump 210 is a current source which either increases, also referred to as "pumps," or reduces, also referred to as "sinks," a charge from an accumulating capacitor (not shown) in the low pass filter 212, also referred to as the PLL loop filter. The value of the change in the charge is proportional to the phase/frequency error generated at the output of the phase/frequency detector 208. The gain of the charge pump 210 is adjusted by changing the charging/sinking current of the current sources within the charge pump 210. In an embodiment, the charge pump 210 is controlled by the calibration engine 260 (FIG. 1). The output of the charge pump 210 is supplied to low-pass filter 212, which integrates the signal on connection 211 and places a DC signal on connection 214 that controls the frequency of the transmit voltage control oscillator (TX VCO) 216. The output of TX VCO 216 is supplied via connection 158 directly to the power amplifier 160. In this manner, the synthesizer 148, limiter 248, modulator 146, limiter 249, divider 260, divider 202, phase/frequency detector 208, charge pump 210, low-pass filter 212 and TX VCO 216 form a phase locked loop (PLL) 220, which is used to determine the transmit frequency on connection 158. When the PLL 220 is settled, or "locked," then the two signals entering the phase/frequency detector 208 on connections 256 and 206 have precisely the same phase and frequency, and the output of the phase/frequency detector 208 on connection 210 goes nearly to zero, with only a negligible residual error.

The output of the integrating low-pass filter 212 on connection 214 stabilizes, resulting in a fixed frequency out of TX VCO 216. For example, the synthesizer 148 and the mixer 226 ensure that the frequency of the signal output from the TX VCO 216 on connection 158 tracks the sum of the frequencies of the local oscillator signal supplied by synthesizer 148 and the IF frequency on connection 206.

When the phase locked loop 220 is locked, the phase of the signal on connection 256 and the phase of the signal on connection 206 will be substantially equal. By using the modulator 146 to impose the I and Q information signals on the signal on connection 204, and because the phase locked loop 220 will keep the phase of the TX VCO locked, the phase of the signal output from the TX VCO 216 on connection 158 will follow that of the phase imposed by the modulator 146.

In accordance with an embodiment of the system and method for closed loop power control calibration, a test signal is injected into the input (the frequency control input) of the TX VCO 216 in a manner that it is not affected by the preceding loop filter 212. In an embodiment, the injected signal is at approximately 100 millivolts (mV) and at a frequency of approximately 1.6 megahertz (MHz). The test signal that is injected into the TX VCO 216 is similar to the injected test signal described above and is generated in a similar manner. In this example, the injected test signal represents the desired bandwidth of the phase locked loop 220. The injected test signal travels through the phase locked loop 220, as indicated using the dotted arrow 296 and is analyzed at the output of the low pass filter 212. This signal is also referred to as a "return" test signal. The bandwidth of the phase locked loop 220 can be determined by determining a difference between the amplitude of the injected test signal and the amplitude of the return test signal. Depending on the amplitude of the return test signal, the calibration engine 260 adjusts the gain of the charge pump 210 so that the bandwidth of the loop is at the desired bandwidth. The operation of the charge pump 210 will be described in greater detail below.

Because the power control element 285 forms a closed loop for AM signals at connection 138, it is possible to use a non-linear, and therefore highly efficient, power amplifier 160. Furthermore, the undesirable and detrimental AM-to-PM conversion, which occurs due to the amplitude dependence of an amplifier's phase shift, is being included within the phase locked loop 220. By separating the AM and the PM modulation and by providing closed loop control for both the AM and PM modulation, a non-linear, and therefore highly efficient power amplifier can be used.

In some applications it is desirable to allow the power amplifier 160 to output a signal containing both an AM component and a PM component, while maintaining the power amplifier 160 as a non-linear (and therefore highly efficient) power amplifier. In such a case, the output of modulator 146 includes both an AM and a PM component, with limiter 249 used to cancel the AM component present on connection 252, thereby preventing any AM-to-PM conversion in the phase/frequency detector 208.

Figure 3:
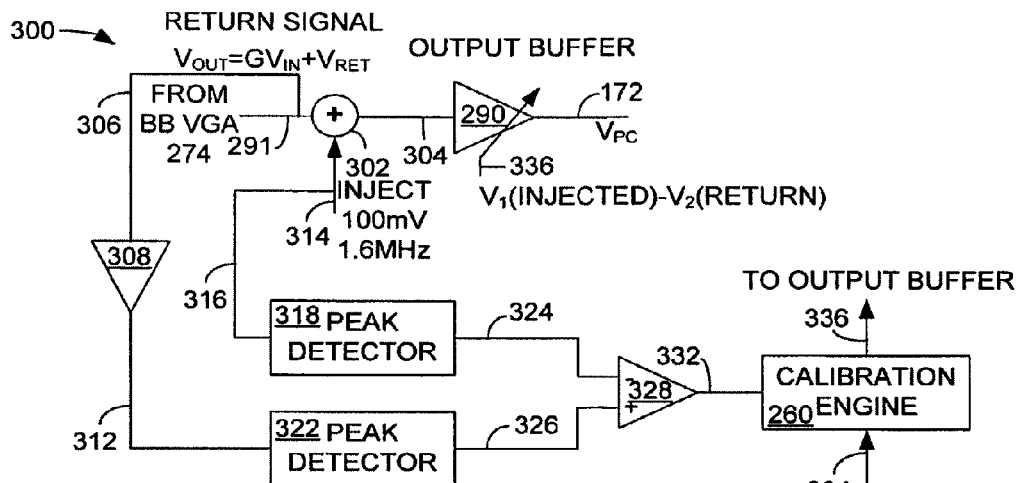
FIG. 3 is a block diagram illustrating the system and method for closed loop power control calibration with respect to calibrating an amplitude-modulated (AM) power control loop.

FIG. 3 is a block diagram illustrating the system and method for closed loop power control calibration with respect to calibrating an amplitude-modulated (AM) power control loop. The AM calibration system 300 comprises an adder 302 at the input 304 of the output buffer 290. The input to the adder 302 on connection 291 is taken from the output of the variable gain element 274 (FIG. 2). The test signal is injected via connection 314 to the adder 302. In this example, the injected test signal is at a level of 100 mV and at a frequency of approximately 1.6 MHz, which is the desired loop bandwidth in this example. In this embodiment, the injected test signal may be referred to as an AM injected test signal. The adder 302 places the injected test signal at the input to the output buffer 290 on connection 304. As described above, the output of the output buffer 290 on connection 172 is supplied as the PA power control voltage, $V_{PC}$. The injected test signal travels through the power control loop formed by the power control element 285 and reappears at connection 291 at the input of the adder 302 as a return test signal. In this embodiment, the return test signal may be referred to as an AM return test signal. The AM return test signal is supplied via connection 306 to a gain buffer 308. In this example, the gain buffer 308 provides a gain of 3 dB; however, this value is arbitrary. In this example, the test signal is at a level of 100 mV and at a frequency of approximately 1.6 MHz, which, in this example, is the bandwidth of the AM power control loop. The injected test signal can be at a level other than 100 mV and at a frequency other than 1.6 MHz.

The power control loop will correct any error in the forward path by the amount of loop gain. If the frequency of the error is at the corner frequency of the power control loop, then the power control loop will reduce the error by 3 dB. Alternatively, the power control loop can reduce the error by another predetermined value, and in a typical implementation, between approximately 1 dB and 4 dB.

The gain buffer 308 is an optional element that allows the peak detectors 318 and 322 to measure signals that are approximately at the same level. In this embodiment, the gain buffer 308 is implemented as a low gain range amplifier that is independent from the absolute value of the injected test signal and the return test signal. Without the gain buffer 308, the injected test signal and the return test signal would need to be accurately measured so that the ratio between their difference and the injected test signal could be determined.

In an embodiment, the gain buffer 308 applies a gain of 3 dB to the AM return signal and supplies the AM return signal via connection 312 to a peak detector 322. The injected test signal on connection 314 is also supplied to a peak detector 318 via connection 316. The output of the peak detector 318 is supplied to a comparator 328 via connection 324 and the output of the peak detector 322 is supplied to the comparator 328 via connection 326. The comparator 328 determines the difference in amplitude between the outputs of the peak detectors 318 and 322 and places a signal representing the difference on connection 332. The output of the comparator 328 is supplied to the calibration engine 260.

It is desirable for each of the peak detectors 318 and 322 to have a substantially similar response. Alternatively, the function of the peak detectors 318 and 322 can be performed by a single peak detector that is commutated between the test signal injection port 314 and the test signal return port 306 and reset in between saving the detected peak value on corresponding sample and hold elements. In operation, the power control loop cannot precisely duplicate the injected test signal and returns the injected test signal to the return test port 306 somewhat attenuated. In order for the injected test signal at the test signal injection port 314 and the return test signal at the test signal return port 306 to be at the same level, the gain in the gain buffer 308 should be equal to the loop gain (actually loss) at the given frequency. Thus, the calibration is performed independent from the exact value of the injected test signal. The value of the gain in the gain buffer 308 is programmable. Thus, the loop bandwidth (not necessarily 1.6 MHz, but in that range) can be accurately calibrated. The range of the attainable bandwidth values depends on the range of the programmable values of the gain in the gain buffer 308. In this example, the range of the programmable values of the gain in the gain buffer 308 is approximately a 3:1 ratio.

The calibration engine 260 receives a "calibration start" signal via connection 334 when calibration is desired. The "calibration start" signal can be supplied by the baseband subsystem 110. The calibration engine 260 analyzes the output of the comparator 328 and if the output dictates, adjusts the gain of the output buffer 290 via connection 336. In an embodiment, the calibration described herein is performed as a single time event during production. In such an embodiment, the results of the calibration are stored in non-volatile memory 122 (FIG. 1) so that the register settings are retained for future operation of the device. Alternatively, the calibration described herein could be done before transmit activity of the radio. In an embodiment, the calibration engine 260 can supply eight (8) gain settings of 0, 2, 3, 4, 5, 6, 7 and 9 dB and steps up the gain from a minimum value. While shown in the baseband subsystem 110, the calibration engine 260 may be located in the RF subsystem 130, so long as it is possible for the comparator 328 to have the ability to write its output to the calibration engine 260.

To determine and calibrate the bandwidth of the power control loop, the amplitude difference between the injected test signal on connection 316 and the AM return test signal on connection 312 is determined. If the amplitude of the AM return test signal is, for example, 3 dB lower than the injected test signal, then the loop bandwidth is equal to the frequency (1.6 MHz) of the injected test signal. However, if the return test signal is attenuated by 1 dB, then the loop bandwidth is too wide and if the return test signal is attenuated by 4 dB, then the loop bandwidth is too narrow. If the bandwidth of the power control loop is either too wide or too narrow, the calibration engine changes the gain of the output buffer 290, so that the return test signal is offset from the injected test signal by the offset amount, in this example, 3 dB. The calibration engine 260 will vary the gain of the output buffer 290 to make the amplitude of the AM return test signal 3 dB lower than the amplitude of the injected test signal. The gain of the output buffer 290 is increased if the bandwidth of the power control loop is too narrow and the gain of the output buffer 290 is decreased if the bandwidth of the power control loop is too wide. The gain of the power control loop is proportional to the loop bandwidth. If the return signal is small the loop bandwidth is increased (i.e., to increase the open loop gain).

Figure 4:
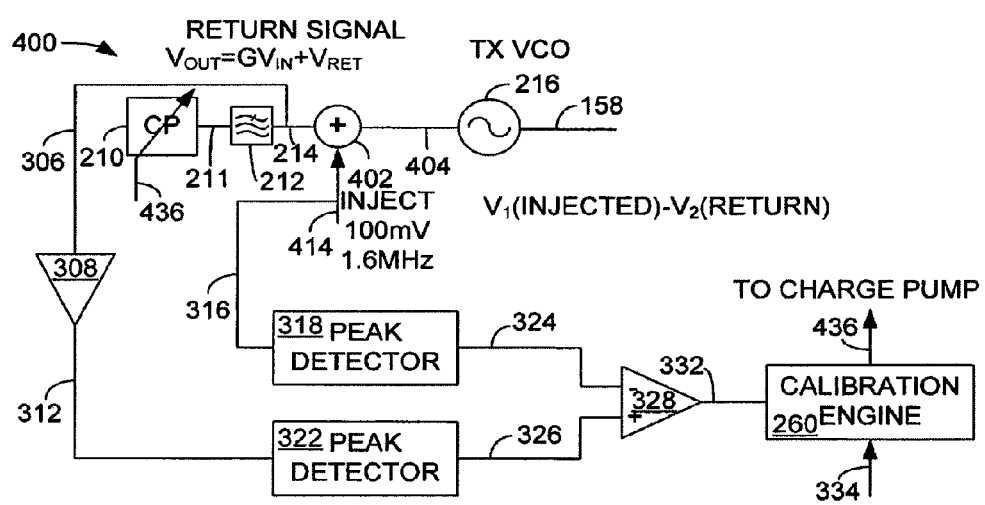
FIG. 4 is a block diagram illustrating the system and method for closed loop power control calibration with respect to calibrating a phase-modulated (PM) power control loop.

FIG. 4 is a block diagram illustrating the system and method for closed loop power control calibration with respect to calibrating a phase-modulated (PM) control loop, which, in this example is the phase locked loop 220 of FIG. 2. The phase-modulated control loop can also be referred to as a frequency modulated (FM) control loop. The PM calibration system 400 is similar to the AM calibration system 300 and uses similar components. The PM calibration system comprises an adder 402 at the input 404 of the TX VCO 216. The input to the adder 402 on connection 214 is taken from the output of the low-pass filter 212 (FIG. 2). An injected test signal is injected via connection 414 to the adder 402. In this embodiment, the injected test signal may be referred to as a PM injected test signal. In this example, the injected test signal is at a level of 100 mV and at a frequency of approximately 1.6 MHz, which is the desired loop bandwidth in this example. The adder 402 places the injected test signal at the input to the TX VCO 216 on connection 404. As described above, the output of the TX VCO 216 on connection 158 is supplied to the power amplifier 160. The injected test signal travels through the power control loop formed by the power control element 285 and through the phase locked loop 220 and reappears at connection 214 as a return test signal. In this embodiment, the return test signal may be referred to as a PM return test signal. The PM return test signal is supplied via connection 306 to a gain buffer 308. In this example, the gain buffer 308 provides a gain of 3 dB; however, this value is arbitrary, as described above. In this example, the test signal is at a level of 100 mV and at a frequency of approximately 1.6 MHz, which, in this example, is the bandwidth of the PM control loop. The injected test signal can be at a level other than 100 mV and at a frequency other than 1.6 MHz. The phase locked loop will correct any error in the forward path by the amount of loop gain. If the frequency of the error is at the corner frequency of the power control loop, then the power control loop will reduce the error by 3 dB. Alternatively, the phase locked loop will reduce the error by another predetermined value, and in a typical implementation, between approximately 1 dB and 4 dB.

In an embodiment, the gain buffer 308 applies a gain of 3 dB to the PM return test signal and supplies the PM return test signal via connection 312 to the peak detector 322. The injected test signal on connection 314 is also supplied to the peak detector 318 via connection 316. The output of the peak detector 318 is supplied to a comparator 328 via connection 324 and the output of the peak detector 322 is supplied to the comparator 328 via connection 326. The comparator 328 determines the difference between the outputs of the peak detectors 318 and 322 and places a signal representing the difference on connection 332. The output of the comparator 328 is supplied to the calibration engine 260.

As stated above, it is desirable for the peak detectors 318 and 322 to have a substantially similar response. Alternatively, the function of the peak detectors 318 and 322 can be performed by a single peak detector that is commutated between the test signal injection port 414 and the test signal return port 306 and reset in between saving the detected peak value on corresponding sample and hold elements. In operation, the power control loop cannot precisely duplicate the injected test signal and returns the injected test signal to the return test port 306 somewhat attenuated. In order for the injected test signal at the test signal injection port 414 and the return test signal at the test signal return port 306 to be at the same level, the gain in the gain buffer 308 should be equal to the loop gain (actually loss) at the given frequency. Thus, the calibration is performed independent from the exact value of the injected test signal. The value of the gain in the gain buffer 308 is programmable. Thus, the loop bandwidth (not necessarily 1.6 MHz, but in that range) can be accurately calibrated. The range of the attainable bandwidth values depends on the range of the programmable values of the gain in the gain buffer 308. In this example, the range of the programmable values of the gain in the gain buffer 308 is approximately A 3:1 ratio.

The calibration engine 260 receives a "calibration start" signal via connection 334 when calibration is desired. The "calibration start" signal can be supplied by the baseband subsystem 110. The calibration engine 260 analyzes the output of the comparator 328 and if desired, adjusts the gain of the charge pump 210 via connection 436. In an embodiment, the calibration described herein is performed as a single time event during production. In such an embodiment, the results of the calibration are stored in non-volatile memory 122 so that the register settings are retained for future operation of the device. Alternatively, the calibration described herein could be done before transmit activity of the radio. In an embodiment, the calibration engine 260 adjusts the gain of the charge pump 210 to provide an output between 300 microamps (.mu.A) and 800 .mu.A. While shown in the baseband subsystem 110, the calibration engine 260 may be located in the RF subsystem 130, so long as it is possible for the comparator 328 to have the ability to write its output to the calibration engine 260.

To determine and calibrate the bandwidth of the phase locked loop 220, the difference between the injected test signal on connection 316 and the PM return test signal on connection 312 is determined. If the amplitude of the PM return test signal is, for example, 3 dB lower than the injected test signal, then the loop bandwidth is equal to the frequency (1.6 MHz) of the injected test signal. However, if the return test signal is attenuated by 1 dB, then the loop bandwidth is too wide and if the return test signal is attenuated by 4 dB, then the loop bandwidth is too narrow. If the bandwidth of the phase locked loop 220 is either too wide or too narrow, the calibration engine changes the gain of the charge pump 210, so that the return test signal is offset from the injected test signal by the offset amount, in this example, 3 dB. The calibration engine 260 will vary the gain of the charge pump 210 to make the amplitude of the PM return test signal 3 dB lower than the amplitude of the injected test signal. In this example, 3 dB is an arbitrary value based on the bandwidth of the power control loop. The gain of the charge pump 212 is increased if the bandwidth of the phase locked loop is too narrow and the gain of the charge pump 212 is decreased if the bandwidth of the phase locked loop is too wide. The value of 3 dB is arbitrary and can differ based on implementation and on the bandwidth. The gain of the phase locked loop is proportional to the loop bandwidth. If the return test signal is small the loop bandwidth is increased (i.e., to increase the open loop gain).

Figure 5:
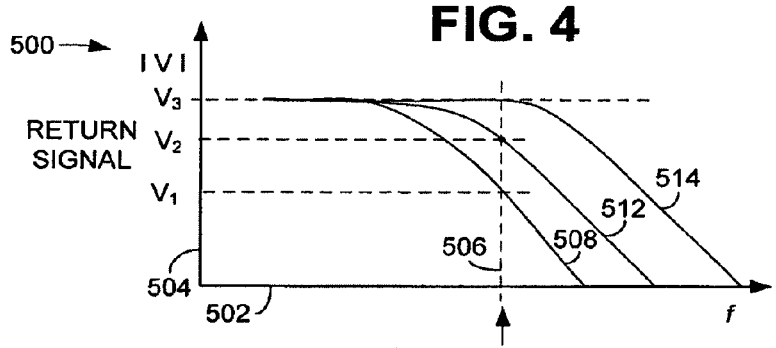
FIG. 5 is a graphical representation showing a response of an example power control loop.

FIG. 5 is a graphical representation showing a response of an example power control loop. The horizontal axis 502 represents frequency (f) and the vertical axis 504 represents the level of the measured return test signal after passing through the power control loop and corresponds to the bandwidth of the power control loop. The voltage $V_2$, illustrated by trace 512, corresponds to the desired difference (ratio) between the injected test signal and the response of the power control loop, as measured by the return test signal. In this example, the injected test signal is 100 mV at a frequency of 1.6 MHz, resulting in a 3 dB target for the power control loop. The voltage $V_1$, illustrated by trace 508, illustrates a power control loop bandwidth that is too narrow and the voltage $V_3$, illustrated by trace 514, illustrates a power control loop bandwidth that is too wide.

Figure 6:
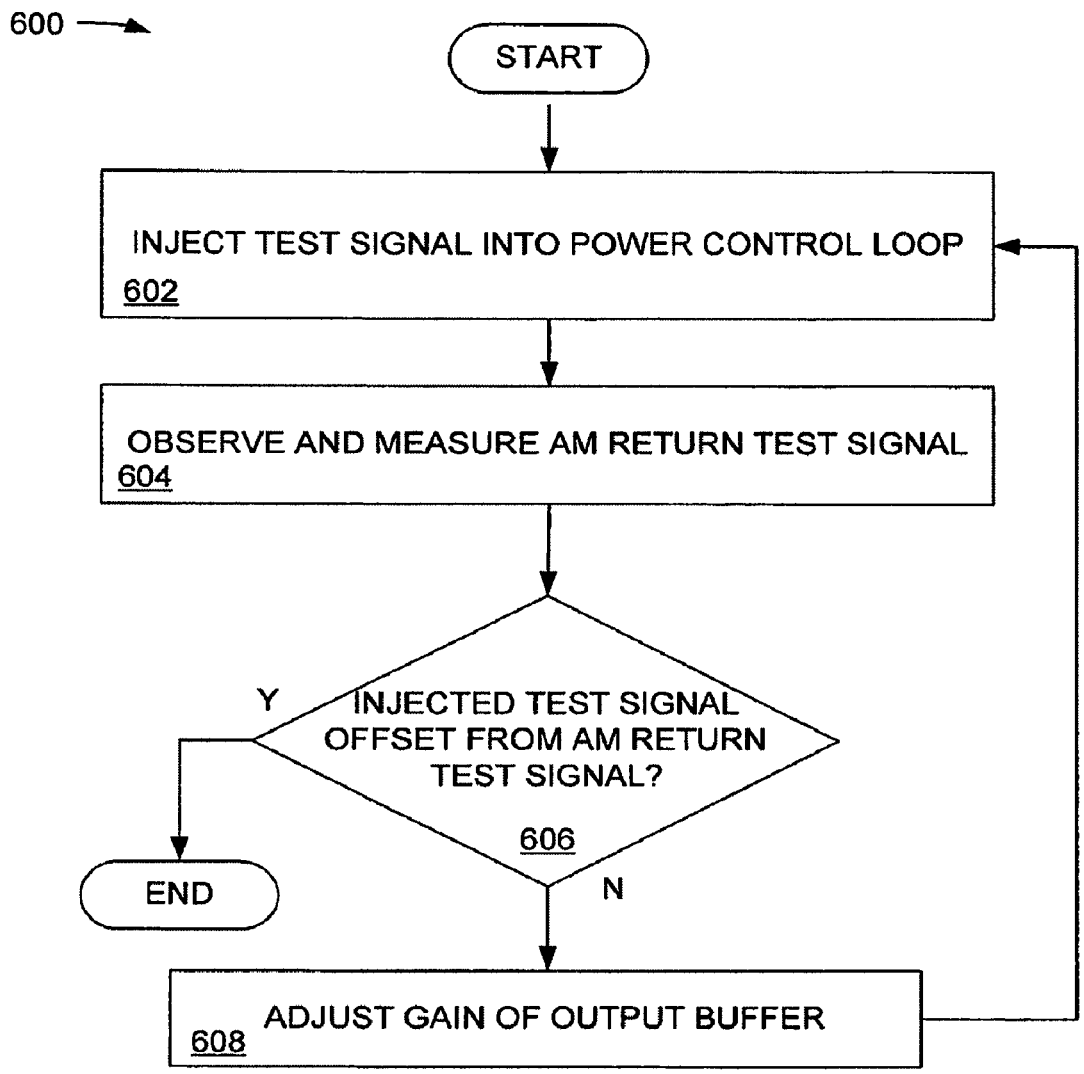
FIG. 6 is a flow chart illustrating the operation of an embodiment of the system and method for closed loop power control calibration with respect to an AM signal.

FIG. 6 is a flow chart illustrating the operation of an embodiment of the system and method for closed loop power control calibration with respect to an AM signal. The blocks in the flow chart can be executed in the order shown, out of the order shown, or substantially in parallel. In block 602, a test signal is injected into the power control loop through the output buffer 290. In this example, the injected test signal is at a frequency of approximately 1.6 MHz and a level of approximately 100 mV. In block 604, the AM return test signal is observed and measured at the input 291 of the adder 302 (FIG. 3). In block 606, the injected test signal is compared against the AM return test signal. If the injected test signal exhibits an error that substantially equals the offset value, in this example, 3 dB, with respect to the return test signal, then the loop bandwidth matches the desired approximate 1.6 MHz, in this example, and the process ends. If the injected test signal exhibits anything other than the offset value, e.g., a 3 dB error, with respect to the return signal, then in block 608, the calibration engine 260 adjusts the gain of the output buffer 290 to match the bandwidth of the power control loop with the injected test signal and the process repeats until the power control loop exhibits the desired bandwidth.

Figure 7:
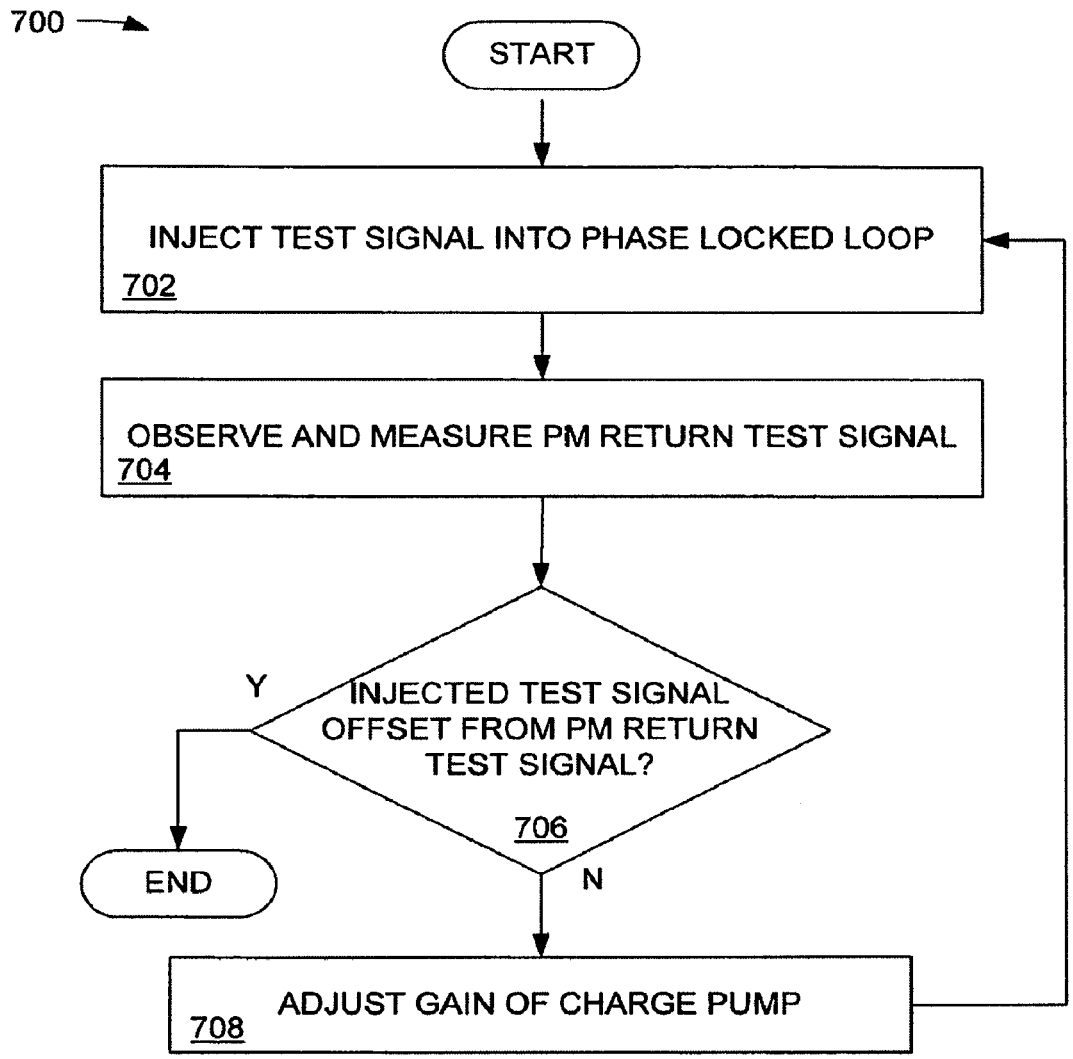
FIG. 7 is a flow chart illustrating the operation of an embodiment of the system and method for closed loop power control calibration with respect to a PM signal.

FIG. 7 is a flow chart illustrating the operation of an embodiment of the system and method for closed loop power control calibration with respect to a PM signal. The blocks in the flow chart can be executed in the order shown, out of the order shown, or substantially in parallel. In block 702, a test signal is injected into the phase locked loop through the TX VCO 216. In this example, the injected test signal is at a frequency of approximately 1.6 MHz and a level of approximately 100 mV. In block 704, the PM return test signal is observed and measured at the input 214 of the adder 402 (FIG. 4). In block 706, the injected test signal is compared against the PM return test signal. If the injected test signal exhibits an error that substantially equals the offset value, in this example, 3 dB, with respect to the return test signal, then the loop bandwidth matches the desired approximate 1.6 MHz, in this example, and the process ends. If the injected test signal exhibits anything other than the offset value, e.g., a 3 dB error, with respect to the return test signal, then in block 708, the calibration engine 260 adjusts the gain of the charge pump 210 to match the bandwidth of the phase locked loop with the injected test signal and the process repeats until the power control loop exhibits the desired bandwidth.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A method for calibrating a closed power control loop comprising:
   injecting a signal into an adjustable element;
   causing the injected signal to travel through the closed power control loop resulting in a return signal;
   comparing the injected signal and the return signal; and
   adjusting the adjustable element based on the comparison so that the return signal is offset from the injected signal by a selected amount.

2. The method of claim 1 further comprising applying the injected signal to at least one of an amplitude-modulated (AM) control loop and a phase-modulated (PM) control loop.

3. The method of claim 2 further comprising equalizing a bandwidth of the amplitude-modulated (AM) control loop and the phase-modulated (PM) control loop.

4. The method of claim 1 wherein adjusting the adjustable element includes adjusting an output buffer.

5. The method of claim 1 wherein adjusting the adjustable element includes adjusting a charge pump.

6. The method of claim 1 further comprising increasing a gain of the adjustable element if an amplitude of the return signal is lower than an amplitude of the injected signal.

7. The method of claim 1 further comprising decreasing a gain of the adjustable element if an amplitude of the return signal is higher than an amplitude of the injected signal.

8. The method of claim 1 wherein comparing the injected signal and the return signal includes measuring a difference between the injected signal and the return signal.

9. A system for calibrating a closed power control loop comprising:
   an adder configured to inject a signal into an adjustable element;
   a first peak detector configured to determine an amplitude of the injected signal;
   a second peak detector configured to determine an amplitude of a return signal;
   a comparator configured to compare the injected signal and the return signal; and
   a calibration engine configured to adjust the adjustable element based on the comparison so that the return signal is offset from the injected signal by a selected amount.

10. The system of claim 9 wherein a desired loop bandwidth signal is applied to at least one of an amplitude-modulated (AM) control loop and a phase-modulated (PM) control loop.

11. The system of claim 9 wherein the adjustable element includes an output buffer.

12. The system of claim 9 wherein the adjustable element includes a charge pump.

13. The system of claim 9 wherein a gain of the adjustable element is increased if the amplitude of the return signal is lower than the amplitude of the injected signal.

14. The system of claim 9 wherein a gain of the adjustable element is decreased if the amplitude of the return signal is higher than the amplitude of the injected signal.

15. The system of claim 10 wherein a bandwidth of the amplitude-modulated (AM) control loop and the phase-modulated (PM) control loop is equalized.

16. The system of claim 9 wherein the comparator is configured to compare the injected signal and the return signal by determining a difference between the injected signal and the return signal.

17. A portable transceiver comprising:
   transmit and receive circuitry, the transmit circuitry having an amplitude-modulated (AM) power control loop and a phase-modulated (PM) phase locked loop; and
   a calibration system for a closed power control loop, the calibration system including an adder configured to inject a signal into an adjustable element, a first peak detector configured to determine an amplitude of the injected signal, a second peak detector configured to determine an amplitude of a return signal, a comparator configured to compare the injected signal and the return signal, and a calibration engine configured to adjust the adjustable element based on the comparison so that the return signal is offset from the injected signal by a selected amount.

18. The portable transceiver of claim 17 wherein the adjustable element in the AM power control loop includes an output buffer.

19. The portable transceiver of claim 17 wherein the adjustable element in the PM phase locked loop includes a charge pump.

20. The portable transceiver of claim 17 wherein a gain of the adjustable element is increased if the amplitude of the return signal is lower than the amplitude of the injected signal.

21. The portable transceiver of claim 17 wherein a gain of the adjustable element is decreased if the amplitude of the return signal is higher than the amplitude of the injected signal.

22. The portable transceiver of claim 17 wherein a bandwidth of the AM power control loop and the PM phase locked loop is equalized.

23. The portable transceiver of claim 17 wherein the comparator is configured to compare the injected signal and the return signal by determining a difference between the injected signal and the return signal.

* * * * *